(12) United States Patent  
Germann et al.

(10) Patent No.: US 7,440,518 B2  
(45) Date of Patent: Oct. 21, 2008

(54) PHASE-LOCKED LOOP CIRCUIT

(75) Inventors: Bernd Germann, Brombachtal (DE); Bardo Müller, Dreieich (DE); Tomislav Drenski, Dreieich (DE)

(73) Assignee: Fujitsu Limited, Kawasaki (JP)

( * ) Notice: Subject to any disclaimer, the term of this patent is extended or adjusted under 35 U.S.C. 154(b) by 453 days.

(21) Appl. No.: 11/197,542

(22) Filed: Aug. 5, 2005

(65) Prior Publication Data

US 2006/0039516 A1 Feb. 23, 2006

Related U.S. Application Data

(63) Continuation of application No. PCT/EP03/02483, filed on Mar. 11, 2003.

(51) Int. Cl.
 *H03D 3/18* (2006.01)
 *H03D 3/24* (2006.01)

(52) U.S. Cl. .............. 375/327; 375/373; 375/376; 327/147; 327/156; 331/25

(58) Field of Classification Search ............ 375/327, 375/373, 376; 327/147, 156; 331/25
 See application file for complete search history.

(56) References Cited

U.S. PATENT DOCUMENTS 4,030,045 A 6/1977 Clark

| | | | |
|---|---|---|---|
| 6,265,362 B1 | 7/2001 | Loderer et al. | |
| 6,265,902 B1 | 7/2001 | Klemmer et al. | |
| 6,441,691 B1 | 8/2002 | Jones et al. | |
| 6,686,803 B1 * | 2/2004 | Perrott et al. | 331/10 |
| 7,061,288 B2 * | 6/2006 | Burgess | 327/156 |

FOREIGN PATENT DOCUMENTS

| | | |
|---|---|---|
| EP | 0 484 158 A2 | 5/1992 |
| EP | 0 511 798 A2 | 11/1992 |
| JP | 61-134125 | 6/1986 |
| JP | 2001-94415 | 4/2001 |

OTHER PUBLICATIONS

Japanese Office Action dated Apr. 1, 2008, 7 pages.

* cited by examiner

*Primary Examiner*—Ted Wang
(74) *Attorney, Agent, or Firm*—Arent Fox LLP.

(57) ABSTRACT

A PLL circuit comprises a controller (DRC) adjusting the frequency of frequency modulated signals ($u_{DIV}$) provided by a frequency modulator (DIV) on the basis of signals provided by a linear range detector (LRD) so that the phase detector gets back into a linear range after a change in the frequency of said frequency modulated signals ($u_{DIV}$) to a desired frequency. The lock time of the phase-locked loop circuit is improved without the requirement of complex circuitry.

20 Claims, 3 Drawing Sheets

PHASE-LOCKED LOOP CIRCUIT

This nonprovisional application is a continuation application of and claims the benefit of international Application No. PCT/EP2003/002483, filed Mar. 11, 2003. The disclosure of the prior application is hereby incorporated herein in its entirety by reference.

The present invention relates to a phase-locked loop (PLL) circuit and in particular to a controller for a phase-locked loop circuit.

PLL circuits are widely used circuit building blocks. A few of their applications are tone decoding, demodulation of AM and FM signals, frequency multiplication, frequency synthesis, pulse synchronisation of signals from noisy sources and the regeneration of signals without noise. Typically, a PLL comprises a phase detector circuit, an amplifier or charge pump, a filter circuit and a voltage controlled oscillator. The phase detector circuit detects the phase difference of two signals. One of these signals is a reference signal. The other one is generated in the PLL. The charge pump generates an analog signal with a high current drive suitable for the control of the VCO. The frequency of the VCO is adjusted until the reference signal and the signal which is compared to the reference signal by the phase detector are synchronised.

Before the signals provided by the charge pump circuit is fed to the VCO, a DC signal is usually generated in a loop filter circuit. This filter circuit averages the signal provided by the charge pump. The charge pump typically generates two fixed current values of the same amount, but opposite sign corresponding to the digital 0 and 1 respectively provided by the phase detector. A zero current at the input of the VCO usually signifies that the VCO maintains its frequency.

The signal generated in the PLL and being compared to the reference signal is not necessarily identical with the signal generated by the VCO. For a very common application, the signal of the VCO is firstly divided by a divider and then fed to the phase detector. The VCO therefore generates a frequency which is by a factor given by the inverse of the divider ratio higher than the reference signal (frequency multiplication).

In digital PLLs, EXOR gates can be used as phase detectors. If the reference signal and the signal generated in the PLL do not have a duty factor of 50% at the beginning, their duty factors are often altered to 50% before comparison by the phase detector. A duty factor of 50% is very suitable for EXOR detectors. In this case, the duty factor of the signal generated by the EXOR gate increases linearly with increasing phase difference between the two compared signals and reaches its maximum value of 100% for a phase difference of 180 degrees and decreases afterwards again. A duty factor of 50% occurs for a phase difference of ±90 degrees. Hence, the charge pump current is zero for a phase difference of ±90 degrees after filtering and the phase shift between the reference signal and the signal compared to the reference signal is ±90 degrees in steady-state conditions.

Using an EXOR gate as phase detector for example, it is extremely difficult to synchronise both signals if the phase difference between both signals is larger than 180 degrees because the relationship between the phase difference signal and the phase difference is no more linear. Such large phase differences can for example occur if the divider ratio is changed, the frequency of the reference signal changes or mechanical stress such as vibrations or shocks is applied to the PLL circuit. The time it takes until the phase-locked loop reaches its steady-state conditions, i.e. the lock time, can take relatively long. Therefore, different means and methods for reducing the lock time have been developed in the state of the art.

The U.S. Pat. No. 6,265,902 discloses a digital phase detector having a slip detection circuit for detecting and compensating for a cycle slip. This digital phase detector is especially suited for signals whose duty factor is not 50%. However, the phase detector is rather complicated as it implies the detection of the leading and trailing edges of both signals compared by the phase detector.

The U.S. Pat. No. 6,265,362 discloses an apparatus that aides in the locking of a phase-locked loop to the correct frequency and that aides in recovering from loss of lock conditions. A disadvantage of the apparatus is that the PLL circuit is rather complex as it requires two slip detectors and a counter.

The U.S. Pat. No. 6,441,691 discloses a further phase detector for a PLL circuit. This phase detector comprises two input circuits, a reset circuit, and two frequency dividers. Disadvantageously, the PLL circuit is as well rather complex.

The object underlying the present invention is to provide a phase-locked loop circuit enabling quick lock times without the requirement of complex circuitry. Further, a corresponding controller and an advantageous method for controlling a frequency modulator are to be provided.

In one aspect of the present invention, a phase-locked loop circuit comprising: a voltage controlled oscillator generating oscillator signals with frequencies dependent on input signals applied to said voltage controlled oscillator; a frequency modulator receiving input signals and generating frequency modulated signals; a phase detector providing phase difference signals on the basis of the phase difference between said frequency modulated signals and further signals; a linear range detector detecting whether said phase detector is in a linear range by analysis of said frequency modulated signals and said further signals and generating linear range signals; is characterised in that a controller receiving said linear range signals controls the frequency of said frequency modulated signals by a frequency adjustment so that said phase detector gets back into said linear range after a change in the frequency of the frequency modulated signals to a desired frequency.

An advantage of the present invention is that the lock time can be shortened because the phase detector operates nearly exclusively in the linear range.

A further advantage is that the shortening of the lock time can be achieved without the requirement of complex circuitry.

In one feature of the present invention, said linear range detector has two outputs for said linear ranges signals, wherein combinations of said linear range signals indicate whether said frequency adjustment is to be performed and whether said frequency adjustment consists of a frequency increase or frequency decrease.

In a further feature of the present invention, said further signals are oscillator signals and said input signals received by said frequency modulator are reference signals. This feature covers a phase-locked loop circuit for which said frequency modulator receives the reference signals and provides said frequency modulated signals on the basis of said reference signals at the output.

In an alternative feature of the present invention, said further signals are reference signals and said input signals received by said frequency modulator are said oscillator signals. This feature covers a phase-locked loop circuit for which said frequency modulator receives said oscillator signals and provides said frequency modulated signals on the basis of said oscillator signals at the output.

In a further feature, said frequency modulator is a divider. Said controller may control a divider ratio of said divider for said frequency adjustment. Said divider ratio may be changed in given steps. When said phase detector is in the linear range again, said divider ratio may be changed in said given steps in order to reach said desired frequency. Alternatively, said divider ratio suitable for generating frequency modulated signals with said desired frequency may be applied when said phase detector is in said linear range again.

In an alternative feature, said frequency modulator is a multiplier. Said controller may control a multiplier ratio of said multiplier for said frequency adjustment. Said multiplier ratio may be changed in given steps. When said phase detector is in the linear range again, said multiplier ratio may be changed in said given steps in order to reach said desired frequency. Alternatively, said multiplier ratio suitable for generating frequency modulated signals with said desired frequency may be applied when said phase detector is in said linear range again.

In another feature of the invention, said phase-locked loop comprises a charge pump providing charge pump signals on the basis of said phase difference signals as input signals applied to said voltage controlled oscillator.

In a further feature, said phase-locked loop comprises a loop filter filtering said input signals applied to said voltage controlled oscillator.

In yet a further feature, said phase detector is an EXOR gate.

In another feature, said linear range detector is an integral part of said phase detector.

In a second aspect, a controller for a phase-locked loop circuit with a voltage controlled oscillator generating oscillator signals with frequencies dependent on input signals applied to said voltage controlled oscillator; a frequency modulator receiving input signals and generating frequency modulated signals; a phase detector providing phase difference signals on the basis of the phase difference between said frequency modulated signals and further signals; a linear range detector detecting whether said phase detector is in a linear range by analysis of said frequency modulated signals and said further signals and generating linear range signals; is characterised in that said controller receiving said linear range signals controls the frequency of said frequency modulated signals by a frequency adjustment so that said phase detector gets back into said linear range after a change in the frequency of said frequency modulated signals to a desired frequency.

In a third aspect of the invention, a method for controlling a frequency modulator receiving input signals and generating frequency modulated signals in a phase-locked loop circuit with a voltage controlled oscillator generating oscillator signals with frequencies dependent on input signals applied to said voltage controlled oscillator; a phase detector providing phase difference signals on the basis of the phase difference between said frequency modulated signals and further signals; a linear range detector detecting whether said phase detector is in a linear range by analysis of said frequency modulated signals and said further signals; is characterised by the following steps: Generation of linear range signals by the linear range detector; Reception of said linear range signals by a controller; Adjustment of the frequency of said frequency modulated signals by the controller so that said phase detector gets back into said linear range after a change in the frequency of said frequency modulated signals to a desired frequency.

BRIEF DESCRIPTION OF THE DRAWINGS

Embodiments of the invention will now be described, by the way of example only, with reference to the following drawings in which:

Referring to FIG. 1, a block diagram of a PLL circuit is shown. The PLL comprises the phase detector PD including a linear range detector LRD, the charge pump CP, the loop filter LF, the voltage controlled oscillator VCO, the divider DIV and the divider ratio control DRC.

The phase detector PD including the linear range detector LRD receives the reference signals $u_{REF}$ and the signals $u_{DIV}$ provided by the divider DIV. Besides it has a further input for the frequency direction signal $u_{FD}$ indicating whether the divider ratio increased or decreased during the last change of the divider ratio.

The phase detector PD generates the phase difference signals $u_{PD}$. The digital signal UPD is converted to an analog signal $u_{CP}$ in the charge pump CP suitable for the control of the VCO.

Before the signal generated by the charge pump $u_{CP}$ is received at the voltage controlled oscillator, the signal $u_{CP}$ is filtered in the loop filter LF which outputs the loop filter signal $u_{LF}$ which controls the VCO. The VCO generates the signal $u_{VCO}$ whose frequency depends on the input signal $u_{LF}$.

The $u_{VCO}$ signal is used by an application A and delivered to the divider DIV. The divider DIV is connected to the phase detector via two signals lines from where the divider DIV receives two control signals $u_{con0}$ and $u_{con1}$. The divider ratio control circuit comprises a further input for division ratio signal $u_{RA}$ with several bits and an output for the divider ratio control signal $u_{DRC}$ received at the input of the divider DIV.

Figure 1:
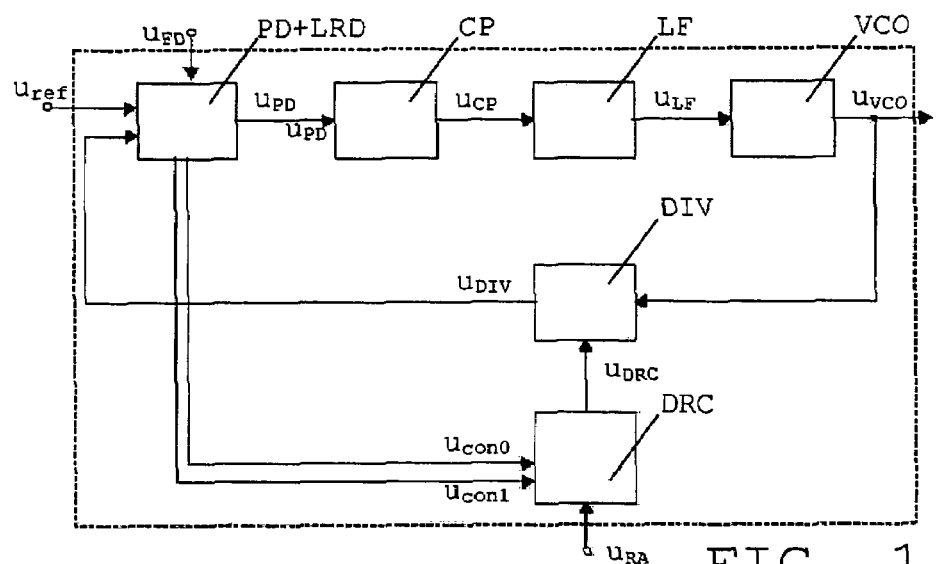
FIG. 1 is a block diagram of a PLL circuit.
Figure 2:
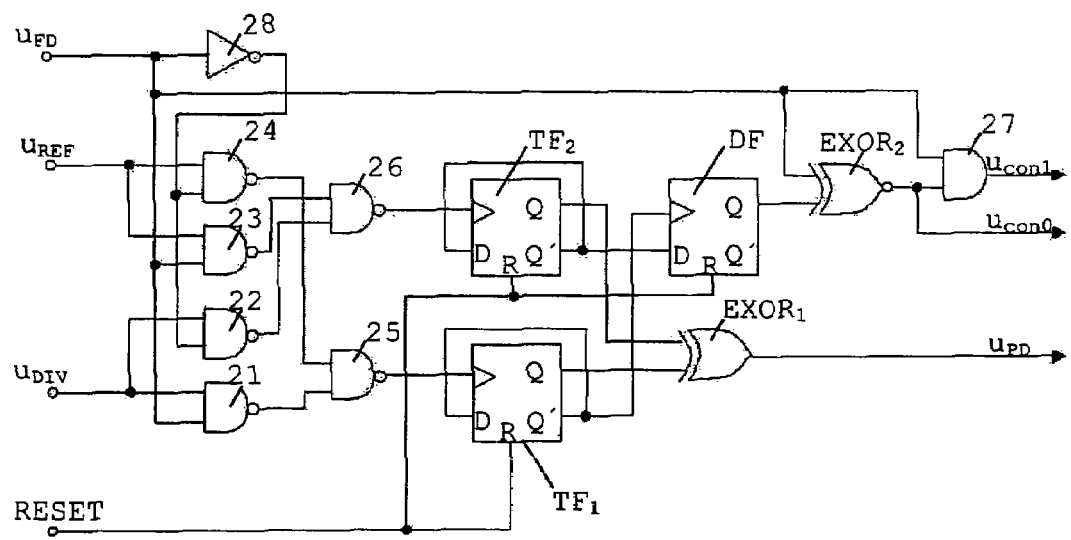
FIG. 2 is a circuit diagram showing the EXOR phase detector including the linear range detector used in the circuit of FIG. 1.

Referring to FIG. 2, a circuit diagram of the EXOR phase detector and the linear range detector used in the circuit of FIG. 1 is shown. The $u_{REF}$ signals and $u_D$ signals and the inverted $u_{FD}$ signals are received at the inputs of a circuit block comprising six NAND gates 21 to 26 and realising two functions $F_{25}$ and $F_{26}$.

The signal provided by the NAND gate 25 corresponds to the function $F_{25}$ given by:

$$F_{25}=(u_{DIV} \cdot u_{FD})+(u_{REF} \cdot u'_{FD}) \tag{1}$$

The signal provided by the NAND gate 26 corresponds to the function $F_{26}$ given by:

$$F_{26}=(u_{REF} \cdot u_{FD})+(u_{DIV} \cdot u'_{FD}) \tag{2}$$

Hence, the $F_{25}=u_{DIV}$ and $F_{26}=u_{REF}$ for $u_{FD}=1$ and the $F_{25}=u_{REF}$ and $F_{26}=u_{DIV}$ for $u_{FD}=0$.

The outputs of the NAND gates 25 and 26 are connected to the trigger inputs of the toggle flip-flops $TF_1$ and $TF_2$. Therefore, the flip-flops $TF_1$ and $TF_2$ toggle with half the frequency of the signals $u_{REF}$ and $u_{DIV}$ and a duty factor of 50% which is most suitable for EXOR phase detectors. The signals $u_{TF1}$ and $u_{TF2}$ at the output of the toggle flip-flops $TF_1$ and $TF_2$ respectively are not shifted with respect to the corresponding signals with twice their frequencies. The signals $u_{TF1}$ and $u_{TF2}$ are analysed in the EXOR gate phase detector $EXOR_1$ which provides the phase difference signals $u_{PD}$ at its output.

The commutation of the $u_{TF1}$ signals and $u_{TF2}$ signals for different values of the frequency direction signals $u_{FD}$ does not influence the operation of the gate $EXOR_1$.

The D flip-flop DF operates as linear range detector. For $u_{FD}=1$, the flip-flop DF is triggered by the signals $u_{TF1}=u'_{REFhalf}$ (the inverse of the signals with half the frequency of the $u_{REF}$ signals), and the signals $u_{TF2}=u'_{DIVhalf}$ (the inverse of the signal with half the frequency of the $u_{DIV}$ signals) are fed to the input of the flip-flop DF whereas, for $u_{FD}=0$, the flip-flop DF is triggered by the signals $u'_{DIVhalf}$ and the signals $u'_{REFhalf}$ are fed to the input of the flip-flop DF. The flip-flop DF outputs the signals $u_{trig}$. For $u_{FD}=1$, $u_{trig}$ corresponds to the value of $u'_{DIVhalf}$ at its D input during the last rise of $u'_{REFhalf}$ from 0 to 1. In case that $u_{trig}=1$, $u'_{DIVhalf}$ is ahead of $u'_{REFhalf}$, i.e. $u_{DIVhalf}$ is ahead of $u_{REFhalf}$, and vice versa in case that $u_{triggered}=0$. For $u_{FD}=0$, $u_{trig}$ corresponds to the value of $u'_{REFhalf}$ at its D input during the last rise of $u_{DIVhalf}$ from 0 to 1. In case that $u_{trig}=1$, $u'_{REFhalf}$ is ahead of $u'_{DIVhalf}$, i.e. $u_{REF}$ is ahead of $u_{DIV}$, and vice versa in case that $u_{trig}=0$. Hence, the value of $u_{trig}$ indicates which one of the two signals $u_{DIV}$ or $u_{REF}$ is ahead. A change in $u_{trig}$ indicates that the order of $u_{DIV}$ or $u_{REF}$ has changed.

The values of $u_{trig}$ and $u_{FD}$ are entered in the negated EXOR gate $EXOR_2$ corresponding to the function $u_{con0}$:

$$u_{con0}=(u'_{trig} \cdot u'_{FD})+(u_{trig} \cdot u_{FD}) \quad (3)$$

The signal $u_{con0}$ cannot solely indicate whether the PLL circuit is in the linear range or not. However, if we ensure that $u_{con0}=0$ in steady-state conditions by means of the divider ratio control DRC, $u_{con0}=1$ automatically signifies that the PLL circuit has left the linear range. In steady-state conditions, $u_{REF}$ is therefore always ahead of $u_{DIV}$. As the order of $u_{REF}$ and $u_{DIV}$ does not matter, this does not result in any limitations. When the sign of $u_{FD}$ changes also the signal corresponding to $u_{trig}$ changes. The commutation of the signals $u_{REF}$ and $u_{DIV}$ by the gates 21 to 26 ensures that $u_{REF}$ and $u_{DIV}$ maintain their relative positions. Otherwise, the relative order of $u_{REF}$ and $u_{DIV}$ would change for different UFD values requiring a cycle slip.

The output of the AND gate 27 is used for the control of the direction in which the divider ratio is changed by a given number. The output of the AND gate 27 is given by the function $u_{con1}$:

$$u_{con1}=u_{con0} \cdot u_{FD} \quad (4)$$

The signal $u_{con1}$ depends on the frequency direction and can be used to indicate the direction of an divider ratio adjustment $\Delta_{DIV}$. If the linear range has been left, the value of $u_{con1}$ indicates whether the divider ratio should be decreased or increased by a certain amount $\Delta_{DIV}$ in order to bring the phase detector back into the linear range. Only three combinations for $u_{con0}$ and $u_{con1}$ can occur. Their signification is given in the following table:

| $u_{con0}$ | $u_{con1}$ | $\Delta_{DIV}$ |
|---|---|---|
| 0 | 0 | 0 |
| 0 | 1 | +1 |
| 1 | 1 | −1 |

The frequency adjustment can be repeated several times depending on the values of $u_{con0}$ and $u_{con1}$ until the phase detector circuit is in the linear range. When the phase detector is in the linear range, the frequency can be changed by an amount $\Delta_{DIV}$ in order to arrive at the desired divider ratio. Alternatively, the desired divider ratio may be applied after a certain hold time.

Figure 3:
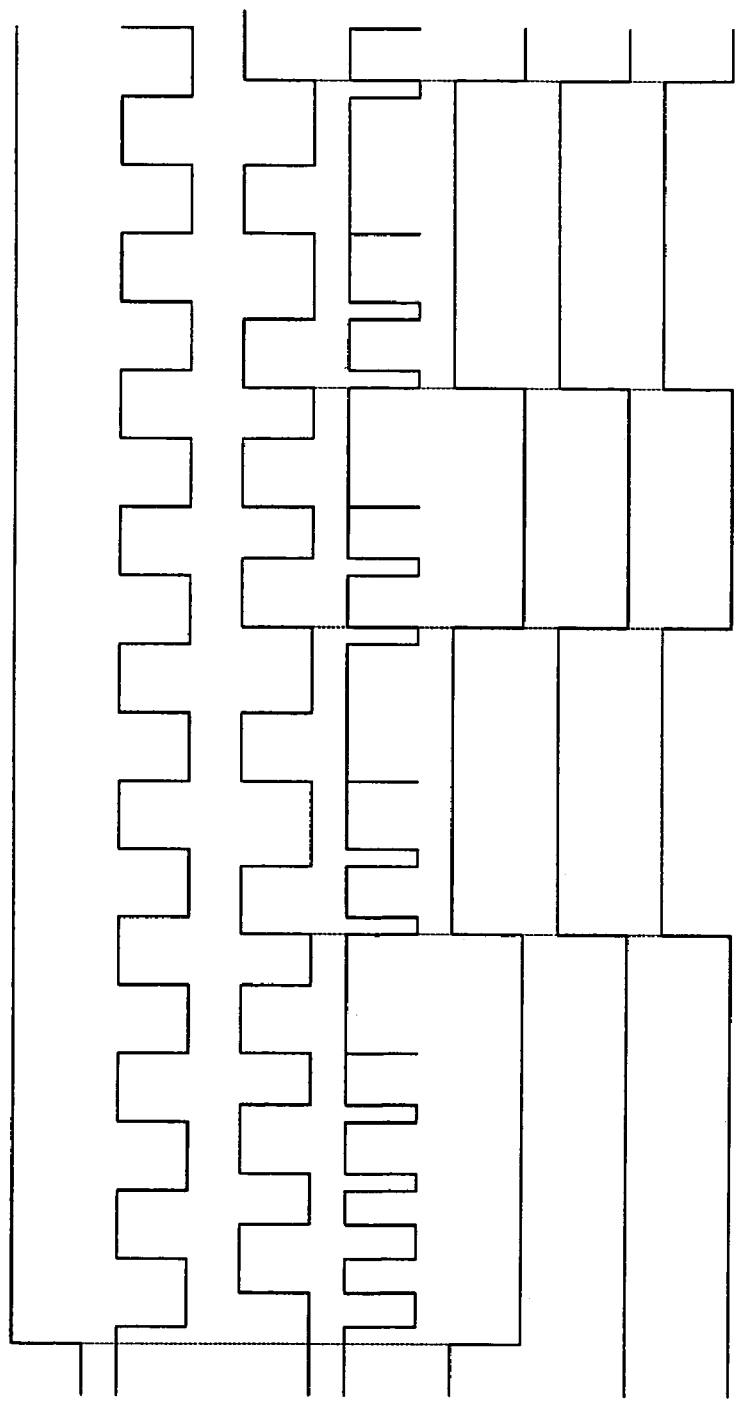
FIG. 3 is a timing diagram for the EXOR phase detector and the linear range detector for a frequency increase.

FIG. 3 shows a timing diagram for the output signals of the toggle flip-flops $TF_1$ and $TF_2$, the D flip-flop DF and the phase detector $EXOR_1$ for an increase of the frequency (the signal indicating the frequency change is set to a high state). When the phase error between the signals provided by the toggle flip-flops $TF_1$ and $TF_2$ accumulates to more than +90 degrees, the D flip-flop rises to a high state indicating the crossing of the linear range border.

The output signals of the D flip-flop DF and the frequency direction signals are encoded with the help of the negated $EXOR_2$ gate and AND gate 27 and transferred to the divider ratio control. The division ratio is reduced at two instances in order to bring the PLL circuit back into the linear range. This procedure repeats until the phase detector is in the linear range.

Figure 4:
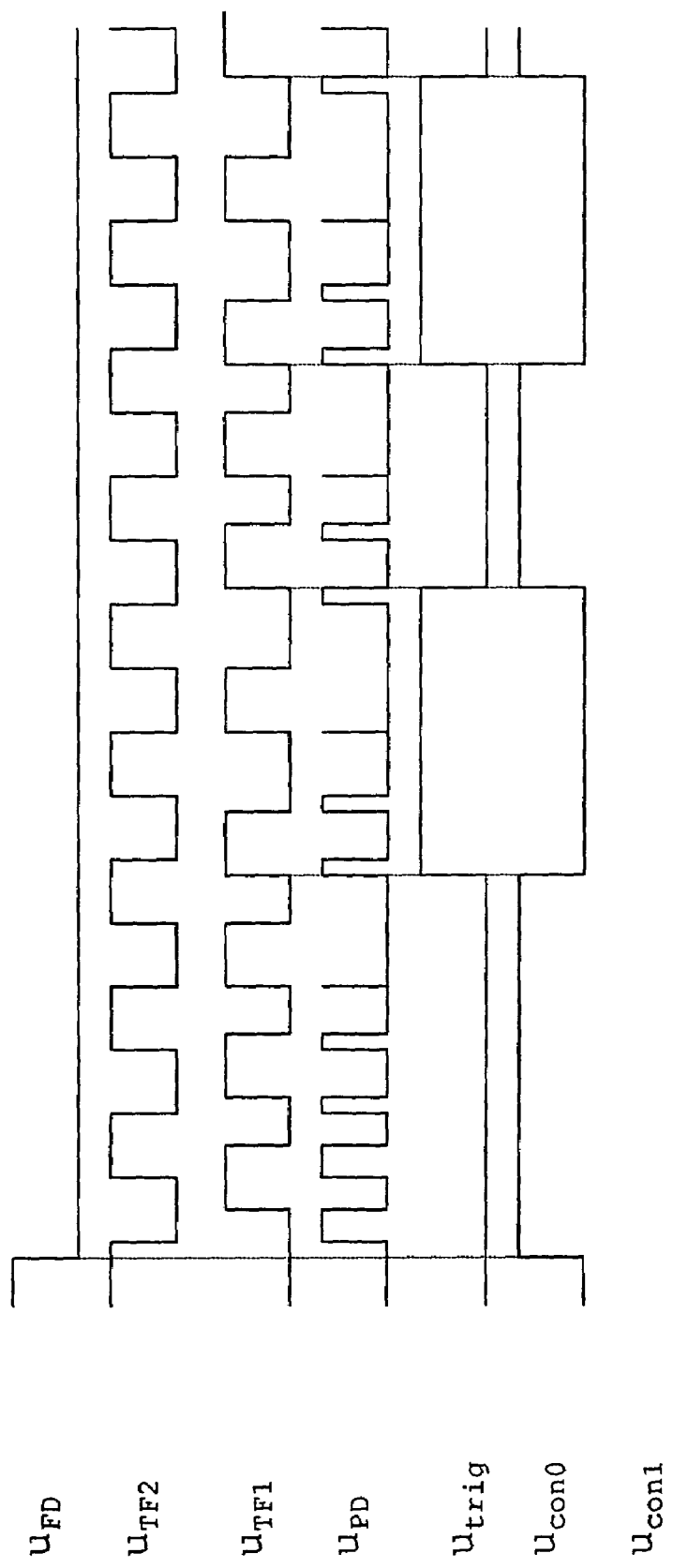
FIG. 4 is a timing diagram for the EXOR phase detector and the linear range detector for a frequency decrease.

FIG. 4 shows a timing diagram for the output signals of the toggle flip-flops $TF_1$ and $TF_2$, the D flip-flop DF and the phase detector $EXOR_1$ for a decrease of the frequency (the signal indicating the frequency change is set to a low state). When the phase error between the signals outputted by the toggle flip-flops $TF_1$ and $TF_2$ accumulates to more than −90 degrees, the D flip-flop rises to a high state indicating the crossing of the linear range border.

The output signals of the D flip-flop DF and the frequency direction signals are encoded with the help of the negated $EXOR_2$ gate and AND gate 27 and transferred to the divider ratio control. The division ratio is reduced at two instances in order to bring the PLL circuit back into the linear range. This procedure repeats until the phase detector is in the linear range.

The invention claimed is:

1. A phase-locked loop circuit comprising:
a voltage controlled oscillator (VCO) generating oscillator signals ($u_{VCO}$) with frequencies dependent on input signals ($u_{cp}$) applied to said voltage controlled oscillator (VCO);
a frequency modulator receiving the oscillator signals ($u_{VCO}$) from the voltage controlled oscillator (VCO) and generating frequency modulated signals ($u_{DIV}$);
a phase detector (PD) providing phase difference signals ($u_{PD}$) on the basis of the phase difference between said frequency modulated signals ($u_{DIV}$) and further signals;
a linear range detector (LRD) detecting whether said phase detector is in a linear range by analysis of said frequency modulated signals ($u_{DIV}$) and said further signals and generating linear range signals ($u_{con0}$, $u_{con1}$);
wherein
a controller (DRC) receiving said linear range signals ($u_{con0}$, $u_{con1}$) controls the frequency of said frequency modulated signals ($u_{DIV}$) by a frequency adjustment so that said phase detector gets back into said linear range after a change in the frequency of the frequency modulated signals ($u_{DIV}$) to a desired frequency.

2. The phase-locked loop circuit according to claim 1, wherein said linear range detector (LRD) has two outputs for said linear ranges signals, wherein combinations of said linear range signals indicate whether said frequency adjustment is to be performed and whether said frequency adjustment is for a frequency increase or a frequency decrease.

3. The phase-locked loop circuit according to claim 1 or 2, wherein said further signals are said oscillator signals ($u_{REF}$) and said input signals received by said frequency modulator are said oscillator signals ($u_{VCO}$).

4. The phase-locked loop circuit according to claim 1 or 2, wherein said frequency modulator is a divider.

5. The phase-locked loop circuit according to claim 4, wherein said controller controls a divider ratio of said divider for said frequency adjustment.

6. The phase-locked loop circuit according to claim 5, wherein said divider ratio is changed in given steps.

7. The phase-locked loop circuit according to claim 6, wherein said divider ratio is changed in said given steps when said phase detector is in said linear range again in order to reach said desired frequency.

8. The phase-locked loop circuit according to claim 5, wherein said divider ratio suitable for generating frequency modulated signals with said desired frequency is applied when said phase detector is in said linear range again.

9. The phase-locked loop circuit according to claim 1 or 2, wherein said frequency modulator is a multiplier.

10. The phase-locked loop circuit according to claim 9, wherein said controller controls a multiplier ratio of said multiplier for said frequency adjustment.

11. The phase-locked loop circuit according to claim 10, wherein said multiplier ratio is changed in given steps.

12. The phase-locked loop circuit according to claim 11, wherein said multiplier ratio is changed in said given steps when said phase detector is in said linear range again in order to reach said desired frequency.

13. The phase-locked loop circuit according to claim 9, wherein said multiplier ratio suitable for generating frequency modulated signals with said desired frequency is applied after the phase detector is in said linear range again.

14. The phase-locked loop circuit according to claim 1 or 2, wherein phase-locked loop comprises a charge pump (CP) providing charge pump signals ($u_{CP}$) on the basis of said phase difference signals ($u_{PD}$) as input signals applied to said voltage controlled oscillator (VCO).

15. The phase-locked loop circuit according to claim 1 or 2, wherein said phase-locked loop comprises a loop filter (LF) filtering said input signals applied to said voltage controlled oscillator (VCO).

16. The phase-locked loop circuit according to claim 1 or 2, wherein phase detector (PD) is an EXOR gate.

17. The phase-locked loop circuit according to claim 1 or 2, wherein said linear range detector (LRD) is an integral part of said phase detector.

18. A controller for a phase-locked loop circuit that comprises a voltage controlled oscillator (VCO) generating oscillator signals ($u_{VCO}$) with frequencies dependent on input signals ($u_{cp}$) applied to said voltage controlled oscillator (VCO); a frequency modulator receiving the oscillator signals ($u_{VCO}$) from the voltage controlled oscillator (VCO) and generating frequency modulated signals ($u_{DIV}$); a phase detector (PD) providing phase difference signals ($u_{PD}$) on the basis of the phase difference between said frequency modulated signals ($u_{DIV}$) and further signals; and a linear range detector (LRD) detecting whether said phase detector is in a linear range by analysis of said frequency modulated signals ($U_D$) and said further signals and generating linear range signals ($u_{con0}$, $u_{con1}$), wherein said controller (DRC) coupled with the linear range detector (LRD) for receiving said linear range signals ($u_{con0}$, $u_{con1}$) controls the frequency of said frequency modulated signals ($u_{DIV}$) by a frequency adjustment so that said phase detector gets back into said linear range after a change in the frequency of said frequency modulated signals ($u_D$) to a desired frequency.

19. A method for controlling a frequency modulator receiving input signals and generating frequency modulated signals ($u_{DIV}$) in a phase-locked loop circuit comprising a voltage controlled oscillator (VCO) for generating oscillator signals ($u_{VCO}$) with frequencies dependent on input signals ($u_{cp}$) applied to said voltage controlled oscillator (VCO), a phase detector (PD) for providing phase difference signals ($u_{PD}$) on the basis of a phase difference between said frequency modulated signals ($u_{DIV}$) and further signals, a linear range detector for detecting whether said phase detector is in a linear range by analysis of said frequency modulated signals ($u_{DIV}$) and said further signals, the method comprising the following steps:

generating linear range signals by the linear range detector ($u_{con0}$, $u_{con1}$);
receiving said linear range signals ($u_{con0}$, $u_{con1}$) by a controller, and;
adjusting the frequency of said frequency modulated signals ($u_{DIV}$) by the controller so that said phase detector gets back into said linear range after a change in the frequency of said frequency modulated signals ($U_{DIV}$) to a desired frequency.

20. A phase-locked loop circuit comprising a voltage controlled oscillator (VCO) generating oscillator signals ($u_{VCO}$) with frequencies dependent on input signals ($u_{cp}$) applied to said voltage controlled oscillator (VCO); a frequency modulator receiving the oscillator signals ($u_{VCO}$) from the voltage controlled oscillator (VCO) and generating frequency modulated signals ($u_{DIV}$); a phase detector (PD) providing phase difference signals ($u_{PD}$) on the basis of the phase difference between said frequency modulated signals ($u_{DIV}$) and further signals; and a linear range detector (LRD) detecting whether said phase detector is in a linear range by analysis of said frequency modulated signals ($u_D$) and said further signals and generating linear range signals ($u_{con0}$, $u_{con1}$); and a controller (DRC) for receiving said linear range signals ($u_{con0}$, $u_{con1}$) from the linear range detector (LRD) to control the frequency of said frequency modulated signals ($u_{DIV}$) by a frequency adjustment so that said phase detector gets back into said linear range after a change in the frequency of said frequency modulated signals ($u_D$) to a desired frequency.

* * * * *